United States Patent
Sato

(10) Patent No.: US 9,425,023 B2
(45) Date of Patent: Aug. 23, 2016

(54) ION GENERATOR AND THERMAL ELECTRON EMITTER

(71) Applicant: Sumitomo Heavy Industries Ion Technology Co., Ltd., Tokyo (JP)

(72) Inventor: Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/721,808

(22) Filed: May 26, 2015

(65) Prior Publication Data

US 2015/0340194 A1    Nov. 26, 2015

(30) Foreign Application Priority Data

May 26, 2014  (JP) ................. 2014-108345

(51) Int. Cl.
*H01J 37/08* (2006.01)
*H01J 37/06* (2006.01)

(52) U.S. Cl.
CPC  *H01J 37/06* (2013.01); *H01J 37/08* (2013.01)

(58) Field of Classification Search
USPC .............. 250/423 R, 424, 426, 427, 423 F; 315/111.01, 111.81, 111.91
See application file for complete search history.

(56) References Cited

U.S. PATENT DOCUMENTS

| 5,497,006 | A | 3/1996 | Sferlazzo et al. | |
|---|---|---|---|---|
| 6,984,831 | B2 | 1/2006 | Low et al. | |
| 2010/0038556 | A1* | 2/2010 | Miyamoto | H01J 1/16 250/423 R |
| 2011/0139613 | A1* | 6/2011 | Ikejiri | H01J 27/022 204/298.12 |
| 2013/0162134 | A1* | 6/2013 | Mattausch | H01J 3/025 313/33 |

FOREIGN PATENT DOCUMENTS

JP    H08-227688 A    9/1996

* cited by examiner

*Primary Examiner* — Nicole Ippolito
(74) *Attorney, Agent, or Firm* — Michael Best & Friedrich LLP

(57) ABSTRACT

An ion generator includes an arc chamber, a cathode that extends outward from the inside of the arc chamber in an axial direction and that emits a thermal electron into the arc chamber, a thermal reflector with a cylindrical shape provided around the cathode in a radial direction and extending in the axial direction, and a narrow structure configured to narrow a width in the radial direction of a gap between the cathode and the thermal reflector at a given position in the axial direction.

16 Claims, 7 Drawing Sheets

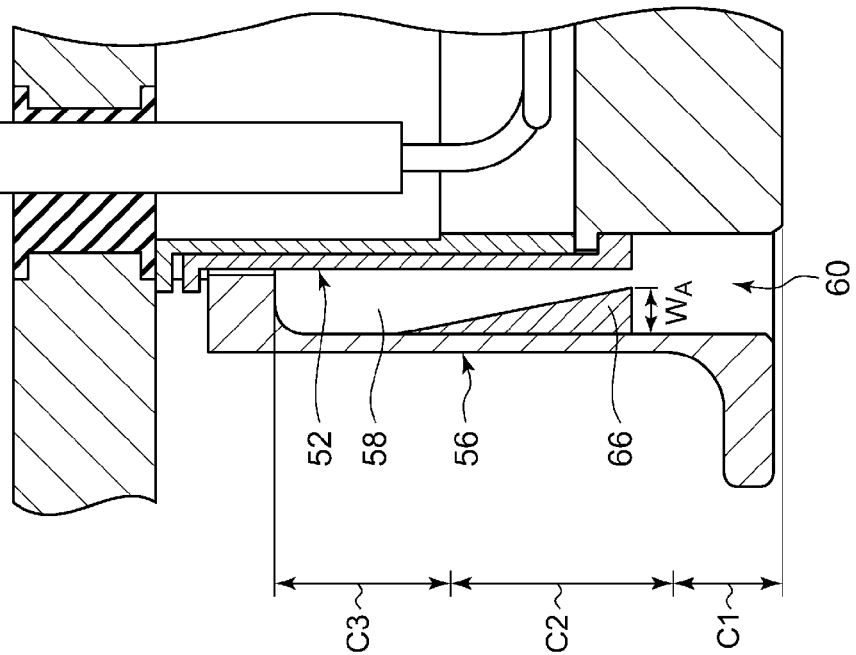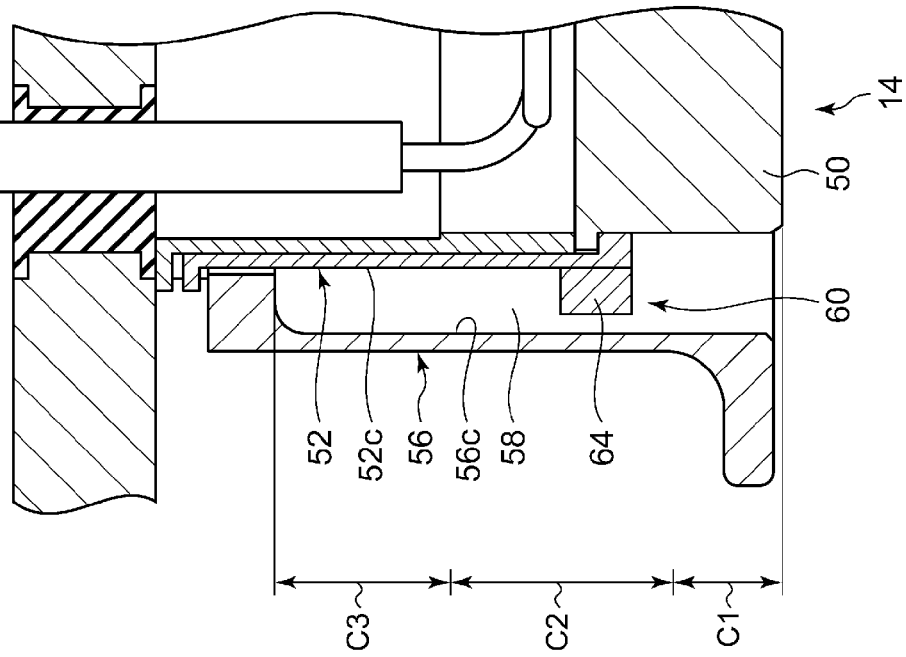

ION GENERATOR AND THERMAL ELECTRON EMITTER

RELATED APPLICATION

Priority is claimed to Japanese Patent Application No. 2014-108345, filed on May 26, 2014, the entire content of which is incorporated herein by reference.

BACKGROUND OF THE INVENTION

1. Field of the Invention

The present invention relates to an ion generator and to a thermal electron emitter used for the ion generator.

2. Description of the Related Art

In a semiconductor manufacturing process, a process of implanting ions into a semiconductor wafer has been implemented as a standard process for the purpose of changing conductivity, for the purpose of changing a crystal structure of the semiconductor wafer, and for some other purposes. An apparatus used in this process is generally called an ion implanter.

As an ion source in such an ion implanter, an indirectly heated cathode ion source is known. In the indirectly heated cathode ion source, a filament is heated by a current to generate thermal electrons which heat a cathode. Thereafter, thermal electrons generated by the heated cathode are accelerated within an arc chamber and collided with source gas molecules therein, so that atoms included in the source gas molecules are ionized. Such a cathode for emitting thermal electrons may comprise, for example, a cathode cap heated by the thermal electron emitted from the filament, and a tubular member of which an end is attached to the cathode cap.

For the source gas molecules to be introduced into the arc chamber, a halide such as a fluoride or a chloride may be used, for example. The source gas molecules of the halide generate halogen radicals in an ionization step, and the halogen radicals act with a component constituting the ion source, such as a metal material for an inner wall of the arc chamber, to form a chemical bond. The chemically-bonded metal material is vaporized and then ionized with the source gas molecules and may be deposited as an ionized substance on the inner wall of the arc chamber or on a surface of the tubular member constituting the cathode.

The cathode cap is preferably maintained at a high temperature in order to improve the generation efficiency of thermal electrons, and the tubular member to which the cathode cap is attached desirably has good thermal insulation properties. However, if a metal material is deposited on the surface of the tubular member when an ion source is operated, the thermal insulation properties of the tubular member are degraded, so that it may be unable to maintain the cathode cap at a high temperature. Accordingly, stable generation of ions will be difficult, requiring maintenance of the component with degraded thermal insulation properties, such as cleaning or replacement. Particularly, in the vicinity of the cathode, which is placed in a high temperature state, a halide tends to dissociate and a metal material is likely to deposit, requiring frequent maintenance. As a result, the productivity is deteriorated in a process using the ion implanter.

SUMMARY OF THE INVENTION

The present invention has been made in view of such a situation, and a purpose thereof is to provide an ion generator and a thermal electron emitter with which maintenance frequency of a cathode can be reduced.

An ion generator of an embodiment of the present invention comprises: an arc chamber; a cathode that extends outward from the inside of the arc chamber in an axial direction and that emits a thermal electron into the arc chamber; a thermal reflector with a cylindrical shape provided around the cathode in a radial direction and extending in the axial direction; and a narrow structure configured to narrow a width in the radial direction of a gap between the cathode and the thermal reflector at a predetermined position in the axial direction.

Another embodiment of the present invention is a thermal electron emitter. The thermal electron emitter generates plasma in an arc chamber and comprises: a cathode that extends outward from the inside of the arc chamber in an axial direction and that emits a thermal electron into the arc chamber; a thermal reflector with a cylindrical shape provided around the cathode in a radial direction and extending in the axial direction; and a narrow structure configured to narrow a width in the radial direction of a gap between the cathode and the thermal reflector at a predetermined position in the axial direction.

Optional combinations of the aforementioned constituting elements, and implementations of the present invention in the form of methods, apparatuses, or systems may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5A is a sectional view that shows a thermal electron emitter according to a modification 1, and FIG. 5B is a sectional view that shows a thermal electron emitter according to a modification 2;

DETAILED DESCRIPTION OF THE INVENTION

Figure 1:
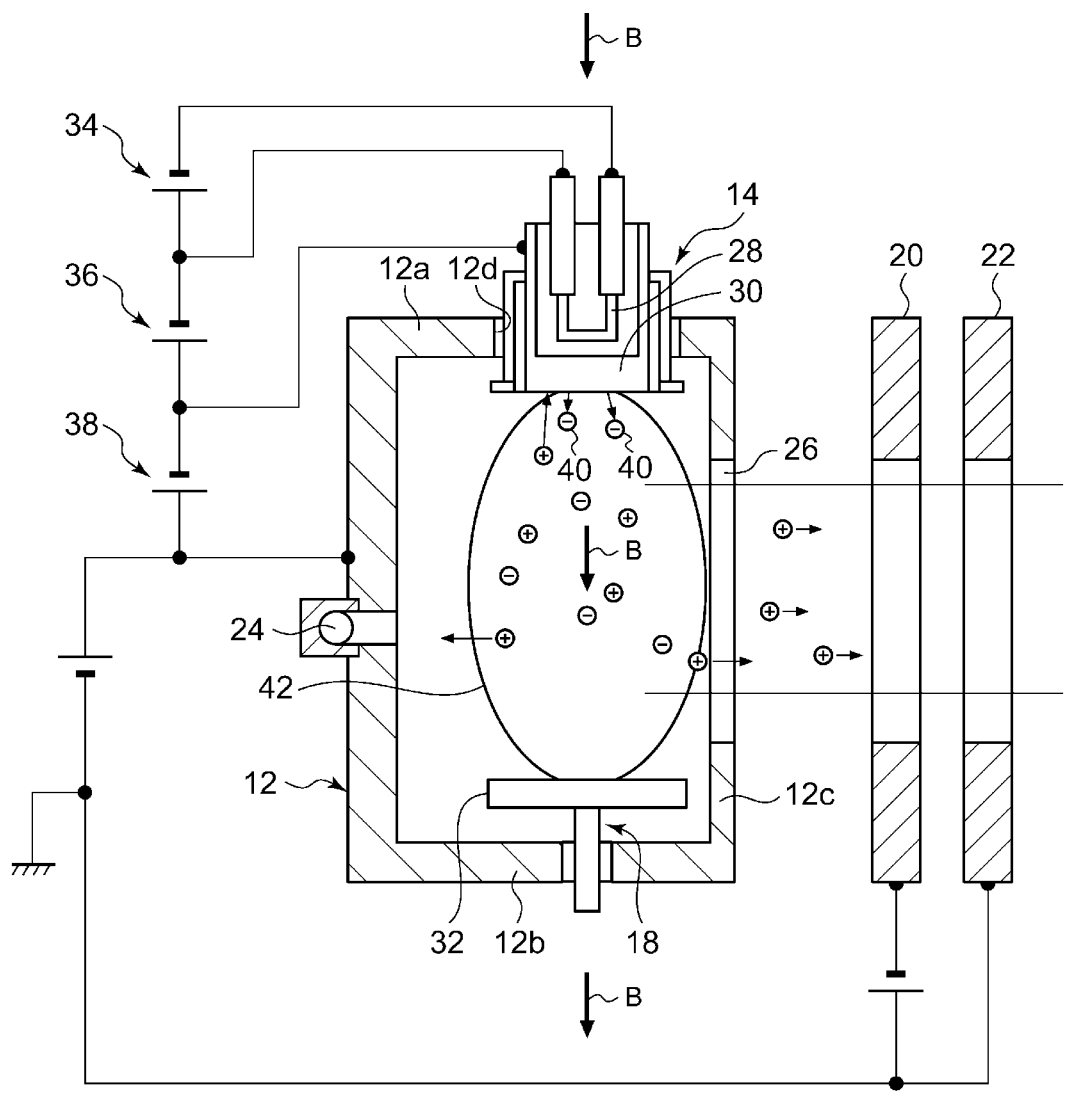
FIG. 1 is a diagram that shows schematic configurations of an arc chamber and a thermal electron emitter in an ion generator according to an embodiment.

The invention will now be described by reference to the preferred embodiments. This does not intend to limit the scope of the present invention, but to exemplify the invention.

Hereinafter, a mode for carrying out the present invention will be described in detail with reference to the drawings. In the drawings, like reference characters designate like or corresponding elements, and the description thereof will not be repeated for brevity. Also, the configurations described below are intended to be illustrative only and do not provide any limitation on the scope of the present invention.

FIG. 1 is a diagram that shows schematic configurations of an arc chamber 12 and a thermal electron emitter 14 in an ion generator 10 according to an embodiment.

An ion generator 10 according to the present embodiment is an indirectly heated cathode type and comprises an arc chamber 12, a thermal electron emitter 14, a repeller 18, a suppression electrode 20, a ground electrode 22, and a variety of power supplies.

The arc chamber 12 has a substantially rectangular parallelepiped shape. The arc chamber 12 is made of a high melting point material, such as a high melting point metal, including tungsten (W), molybdenum (Mo), and tantalum (Ta), an alloy of those, graphite (C), or the like. Therefore, even in an environment where the temperature in the arc chamber becomes relatively high, the arc chamber would be hard to melt.

The arc chamber 12 includes an upper surface plate 12a, a lower surface plate 12b, and side wall plates 12c. On the side wall plates 12c are formed a gas introducing port 24 that introduces a source gas, and a front slit 26 that is an opening through which an ion beam is extracted. Also, the thermal electron emitter 14 is provided through the upper surface plate 12a, and the repeller 18 is inserted through the lower surface plate 12b.

In the following description, the direction from the upper surface plate 12a toward the lower surface plate 12b may be referred to as an axial direction, and a direction perpendicular to the axial direction may be referred to as a radial direction. Further, the internal part of the arc chamber 12 is also referred to as the inside, and the external part of the arc chamber 12 is also referred to as the outside.

The thermal electron emitter 14, which emits a thermal electron into the arc chamber, includes a filament 28 and a cathode 30. The thermal electron emitter 14 is inserted into an attachment hole 12d in the upper surface plate 12a and fixed so as to be insulated from the arc chamber 12.

The filament 28 is heated by a filament power supply 34 and generates thermal electrons at the tip. The (primary) thermal electrons generated from the filament 28 are accelerated in a cathode electric field generated by a cathode power supply 36, so as to be collided with the cathode 30, which is heated with the heat generated by the energy of the collision. Thereafter, the heated cathode 30 generates (secondary) thermal electrons 40, which are accelerated by an arc voltage applied between the cathode 30 and the arc chamber 12 by an arc power supply 38 and are then emitted into the arc chamber 12 as beam electrons having sufficient energy for ionizing gas molecules.

The repeller 18 includes a repeller plate 32. The repeller plate 32 is provided at a position opposite to the thermal electron emitter 14 so as to face the cathode 30 and to be almost parallel thereto. The repeller plate 32 repels electrons within the arc chamber to keep the electrons at a region where plasma 42 is generated, thereby improving the generation efficiency of ions.

Figure 2:
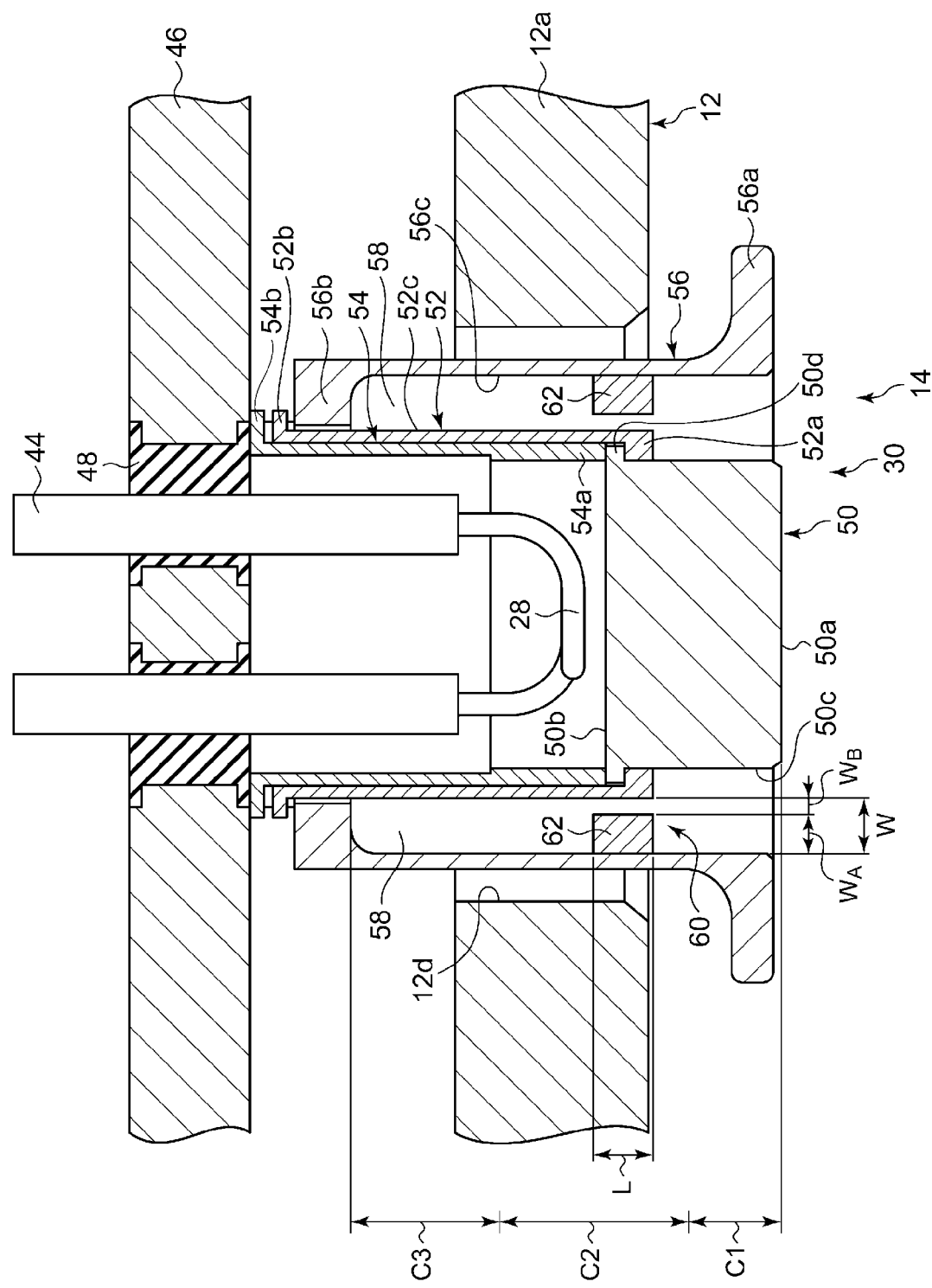
FIG. 2 is a sectional view that shows a configuration of the thermal electron emitter according to the embodiment.
Figure 3:
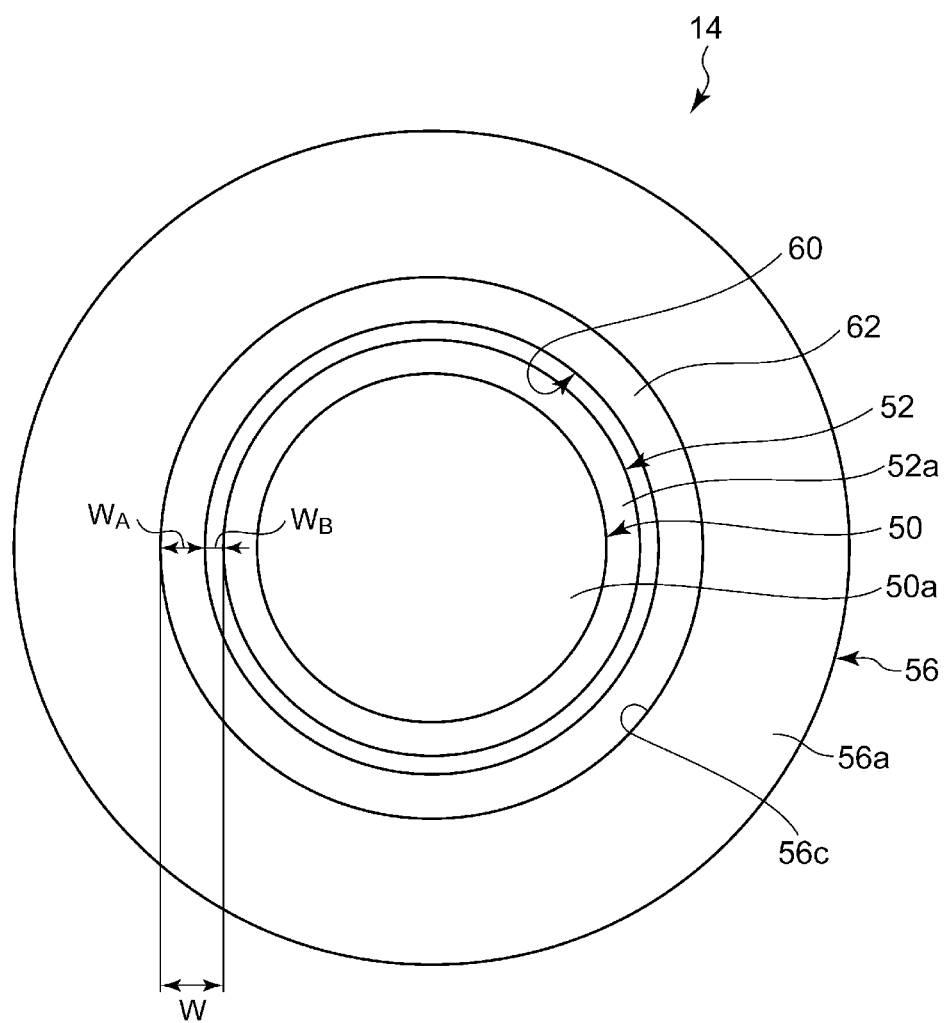
FIG. 3 is a top view that shows a configuration of the thermal electron emitter according to the embodiment.

Next, the configuration of the thermal electron emitter 14 will be detailed with reference to FIGS. 2 and 3. FIG. 2 is a sectional view that shows a configuration of the thermal electron emitter 14 according to the embodiment, and FIG. 3 is a top view that shows a configuration of the thermal electron emitter 14 according to the embodiment.

The thermal electron emitter 14 comprises the filament 28, the cathode 30, a thermal reflector 56, and a narrow structure 60. The cathode 30 includes a cathode cap 50, a thermal break 52, and a cathode retainer 54. The thermal electron emitter 14 is inserted through the attachment hole 12d with a gap to the inner wall of the attachment hole 12d so as not to be in contact with the upper surface plate 12a of the arc chamber 12 and is fixed to an attachment plate 46. The cathode 30 and thermal reflector 56 have the same potential that is an arc potential which is different from a potential applied to the arc chamber 12.

The cathode cap 50 is a member that is heated by the thermal electrons emitted from the filament 28 to emit the thermal electrons into the arc chamber and is made of a high melting point material, including tungsten (W) and tantalum (Ta), for example. The cathode cap 50 has a column shape with the thickness in the axial direction, such as a cylindrical shape. Also, the cathode cap 50 includes a front surface 50a that faces the internal space of the arc chamber 12, a rear surface 50b that faces the filament 28, and a side surface 50c. On the rear surface 50b is provided a flange 50d that protrudes outward in the radial direction from the side surface 50c. The flange 50d is sandwiched and latched between the thermal break 52 and the cathode retainer 54. Therefore, the cathode cap 50 is fixed to ends of the thermal break 52 and the cathode retainer 54 and protrudes from a latch end 52a toward the inside of the arc chamber 12.

The thermal break 52 is a cylindrical member that extends outward from the inside of the arc chamber 12 in the axial direction and fixes the cathode cap 50. The thermal break 52 has, for example, a cylindrical shape corresponding to the shape of the cathode cap 50. Also, the thermal break 52 is made of a high melting point material, including tungsten (W) and tantalum (Ta), for example. Further, the thermal break 52 has the latch end 52a for latching the cathode cap 50, and an attachment end 52b used for attaching itself to the attachment plate 46 provided outside the arc chamber 12. The attachment end 52b may be directly attached to the attachment plate 46 or may be indirectly attached to the attachment plate 46 via the cathode retainer 54. Namely, the thermal break 52 may be fixed to the cathode retainer 54 at the attachment end 52b.

In order to maintain the cathode cap 50 in a high temperature state, the thermal break 52 desirably has a shape exhibiting good thermal insulation properties i.e. low thermal conductivity, such as a shape that is long in the axial direction and has a small wall thickness. The thermal break 52 having such a shape can improve the thermal insulation properties between the cathode cap 50 and attachment plate 46. Accordingly, the cathode cap 50 heated by the thermal electrons emitted from the filament 28 is less likely to transfer heat toward the attachment plate 46 via the thermal break 52.

The cathode retainer 54 is a member that is provided inside the thermal break 52 and has a cylindrical shape extending in the axial direction along the thermal break 52. The cathode retainer 54 is made of a high melting point material, including tungsten (W) and tantalum (Ta), for example. Also, the cathode retainer 54 has a fixing end 54a for fixing the cathode cap 50, and an attachment end 54b used for attaching itself to the attachment plate 46. As with the thermal break 52, the cathode retainer 54 also desirably has a shape that is long in the axial direction and has a small wall thickness for good thermal insulation properties.

The filament 28 is connected to two lead electrodes 44, which are fixed to the attachment plate 46 provided outside the arc chamber 12 via insulation parts 48. The filament 28 is formed by bending a tungsten wire in a spiral shape. The filament 28 is provided within the cathode 30 composed of the cathode cap 50, thermal break 52, and cathode retainer 54. Accordingly, the filament 28 is separated from plasma generated in the internal space of the arc chamber 12, thereby preventing deterioration of the filament 28.

The thermal reflector 56 is provided around the cathode cap 50 and thermal break 52 in the radial direction and has a cylindrical shape facing an outer surface 52c of the thermal break 52 and extending in the axial direction. The thermal reflector 56 is made of a high melting point material, such as tungsten (W), tantalum (Ta), and graphite (C) for example. Also, the thermal reflector 56 has an open end 56a that extends outward in the radial direction near the front surface 50a of the cathode cap 50, and a connection end 56b that extends inward in the radial direction near the attachment end 52b of the thermal break 52 so as to be connected to the thermal break 52.

The thermal reflector 56 reflects radiation heat emitted from the cathode cap 50 in a high temperature state back to the cathode cap 50, so as to maintain the cathode cap 50 at a high temperature. The thermal reflector 56 desirably extends in the axial direction over a region that faces the side surface 50c of the cathode cap 50 so as to be able to reflect radiation heat from the side surface 50c. In other words, the thermal reflector 56 desirably extends in the axial direction toward the inside of the arc chamber 12 beyond the thermal break 52 that latches the cathode cap 50.

Also, the thermal reflector 56 is desirably attached to the thermal break 52 near the attachment end 52b of the thermal break 52. In other words, the thermal reflector 56 is desirably attached to a position apart from the cathode cap 50 and the latch end 52a of the thermal break 52. If the thermal reflector 56 is attached near the cathode cap 50 and the latch end 52a of the thermal break 52, heat of the cathode cap 50 is easily transferred to the thermal reflector 56, so that maintaining the temperature of cathode 50 high enough would become more difficult.

There is a gap 58 between the cathode cap 50 with the thermal break 52 and the thermal reflector 56, and the narrow structure 60 is configured to narrow the width W of the gap 58 in the radial direction down to a width $W_B$ smaller than the width W at a predetermined position in the axial direction. As shown in FIG. 2, the narrow structure 60 includes a protruding part 62 that protrudes inward in the radial direction from an inner surface 56c of the thermal reflector 56. Alternatively, the narrow structure 60 may include a protruding part that protrudes outward in the radial direction from the outer surface 52c of the thermal break 52, as described in a modification shown in FIG. 5A described later, or may include protruding parts 68a, 68b, 69a, and 69b that protrude from the thermal break 52 and thermal reflector 56, as described in modifications shown in FIGS. 6A and 6B described later.

The protruding part 62 narrows the width of the gap 58 in the radial direction to the small width $W_B$ at the position where the protruding part 62 is provided. The protruding part 62 is desirably provided to make the width $W_B$ of the gap 58 at the position where the protruding part 62 is provided to be half of the original width W of the gap 58 or less. In other words, the protrusion width $W_A$ of the protruding part 62 in the radial direction is desirably larger than the width $W_B$ of the gap 58. Also, the length L of the protruding part 62 in the axial direction is desirably twice the width $W_B$ of the gap 58 or more. For example, when the original width W of the gap 58 is about 2 mm, the width $W_B$ of the gap 58 may be set to around 0.2 mm to 1 mm, and the length L in the axial direction may be set to around 1 mm to 3 mm; preferably, the width $W_B$ of the gap 58 may be set to about 0.5 mm, and the length L in the axial direction may be set to about 1.5 mm.

The protruding part 62 is provided on the inner surface 56c of the thermal reflector 56 extending in the axial direction, at a position near the latch end 52a of the thermal break 52. When the gap 58 is divided into three regions of a top region C1, a middle region C2, and a bottom region C3 according to the position in the axial direction, the position near the latch end 52a mentioned above means a position that falls within the middle region C2. The top region C1 is a region near the internal space of the arc chamber 12 and is specifically a region extending from a middle position between the front surface 50a and rear surface 50b of the cathode cap 50 in the axial direction toward the front surface 50a. The bottom region C3 is a region apart from the internal space of the arc chamber 12 and is specifically a region extending from a middle position between the latch end 52a of the thermal break 52 and the connection end 56b of the thermal reflector 56 in the axial direction toward the connection end 56b. The middle region C2 is a region located between the top region C1 and the bottom region C3.

By providing the protruding part 62 in the middle region C2, plasma generated in the internal space of the arc chamber 12 is made difficult to enter the inner region of the gap 58, or the bottom region C3. Also, by not providing the protruding part 62 in the bottom region C3, the width W of the inner region of the gap 58 in the radial direction can be made larger, so that plasma passing through the part narrowed by the protruding part 62 can be diluted in the bottom region C3. Accordingly, the influence of exposing the thermal break 52 and thermal reflector 56, which define the bottom region C3, to high-density plasma can be reduced. Further, by not providing the protruding part 62 in the top region C1, the emission of thermal electrons from the side surface 50c of the cathode cap 50 is not disturbed. Accordingly, reduction of the amount of thermal electrons emitted from the cathode 30 can be prevented, thereby improving the generation efficiency of ions.

As shown in FIG. 3, the protruding part 62 is continuously disposed along the inner surface 56c in a circumferential direction and formed in a ring shape surrounding the thermal break 52 or the cathode cap 50. Also, the protruding part 62 is provided so that the width $W_B$ of the gap 58 is constant even at a different position in the circumferential direction. In a modification, the protruding part 62 may be formed so that the width $W_B$ of the gap 58 is different at a different position in the circumferential direction or may be formed only at partial positions in the circumferential direction.

To the ion generator 10 having the aforementioned configuration is applied an external magnetic field B induced by a source magnet coil in the axial direction connecting the cathode 30 and the repeller 18, as shown in FIG. 1. Also, since the repeller 18 is provided so as to face the cathode 30 that emits beam electrons, the beam electrons reciprocate between the cathode 30 and the repeller 18 along the magnetic field B. The reciprocating beam electrons then collide with and ionize source gas molecules introduced into the arc chamber 12 to generate ions, so as to generate the plasma 42 in the arc chamber 12. Since the beam electrons mostly exist within a range restricted by the applied magnetic field, ions are mainly generated within the range; the ions then reach, by diffusion, the inner wall of the arc chamber 12, the front slit 26, the cathode 30, or the repeller 18 and are lost on the wall surface.

As the source gas, there is used a noble gas, hydrogen ($H_2$), a hydride such as phosphine ($PH_3$) or arsine ($AsH_3$), or a halide including a fluoride such as boron trifluoride ($BF_3$) or germanium tetrafluoride ($GeF_4$) and a chloride such as indium trichloride ($InCl_3$) and an iodide such as indium iodide (InI) and so on. In addition, a substance containing an oxygen atom (O), such as carbon dioxide ($CO_2$), carbon monoxide (CO), and oxygen ($O_2$), may also be used for the source gas. Such a source gas is introduced into the arc chamber 12 via the gas introducing port 24 and ionized by the beam electron consisted of the (secondary) thermal electrons 40. However, when energized ions by the arc voltage are incident on and collided with the inner wall of the arc chamber 12, the cathode 30, or the repeller 18, they cause wear of a constituent material (W, Ta, Mo, graphite, or the like) of each component by sputtering or chemical etching.

In the case where the source gas is a fluoride, e.g., $BF_3$, there may be generated $BF^+$, $BF_2^+$, $F^+$, and $F_2^+$ by ionization and, when such ions are neutralized on a wall surface within the arc chamber 12, highly reactive fluorine radicals, such as F and $F_2$, are generated. The fluorine radical may be chemically bonded with a material of a component constituting the ion generator 10, so as to form a fluoride, such as $WF_x$, $TaF_x$, $MoF_x$, or $CF_x$. Thereafter, such a fluoride is vaporized at a relatively low temperature and ionized within the arc chamber 12, so as to reach and adhere to the inner wall of the arc chamber 12 or the like as an ionized substance, such as $WF_x^+$, $TaF_x^+$, $MoF_x^+$, or $CF_x^+$.

Such ionized substances containing a halide may also adhere to the thermal break 52 or the like included in the thermal electron emitter 14. Since the thermal break 52 or the like in the cathode 30 is placed in a high temperature state during the operation of the ion generator 10, F or other halogen included in the adhering substances may be dissociated by heat decomposition, so that a substance having relatively high heat conductivity, such as W, Ta, Mo, and C, may be deposited. Accordingly, the thickness of the thermal break 52 will be increased and thermal conductivity will become high, so that the thermal insulation properties of the thermal break 52 will be degraded as the deposit is increased. Consequently, increased electric power must be supplied to the filament 28 in order to maintain the temperature of the cathode cap 50.

However, since the power supply capacity of the filament power supply 34 generally has an upper limit, if the thermal insulation properties of the thermal break 52 are significantly degraded, it may be unable to maintain the cathode cap 50 at a required temperature even if the maximum amount of electric power is supplied from the filament power supply 34. If the temperature of the cathode cap 50 cannot be maintained, the amount of thermal electrons generated by the thermal electron emitter 14 may be unable to reach the target value, so that the generation efficiency of ions may be reduced and the amount of generated ions may be decreased. Accordingly, ion beams having the intended amount of current cannot be extracted from the ion generator 10, requiring maintenance such as replacement of the cathode 30 in order to recover the thermal insulation properties. As a result, frequent maintenance will reduce the operation availability of the ion generator 10, causing deterioration of productivity in the process using the ion implanter. In addition, frequent replacement of the cathode 30 will also increase the maintenance cost.

When a substance containing an oxygen atom is used as a source gas, there is generated an oxygen radical within the arc chamber 12, which causes corrosive wear of a constituent material (W, Ta, Mo, graphite, or the like) of each component of the ion generator 10. Particularly, around the cathode 30 placed in a high temperature state, the degree of corrosive wear caused by oxygen radicals is greater. If corrosive wear is caused on a part having a small wall thickness of the thermal break 52 or thermal reflector 56, such a component may be detached. Accordingly, stable generation of plasma will be difficult, requiring maintenance of the damaged component. As a result, frequent maintenance will reduce the operation availability of the ion generator 10, causing deterioration of productivity in the process using the ion implanter and increase of the maintenance cost.

Figure 4:
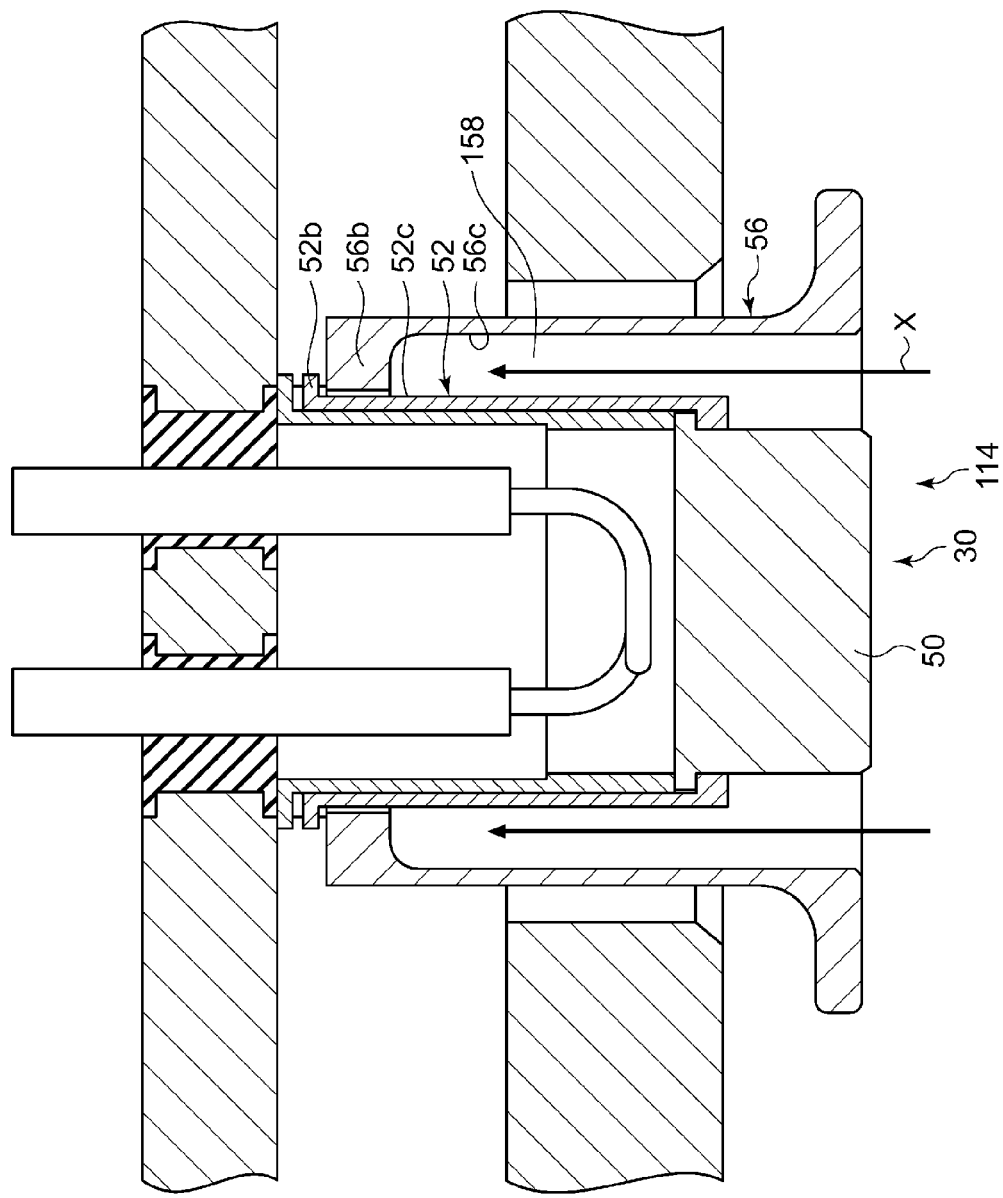
FIG. 4 is a schematic diagram that shows a thermal electron emitter according to a comparative example.

The problem stated above will be detailed with reference to a comparative example shown in FIG. 4. FIG. 4 is a schematic diagram that shows a thermal electron emitter 114 according to a comparative example. The thermal electron emitter 114 has the same configuration as the thermal electron emitter 14 according to the embodiment, except that the protruding part 62 constituting the narrow structure 60 provided in the thermal electron emitter 14 according to the embodiment is not provided in the thermal electron emitter 114.

Since the narrow structure 60 is not provided in the comparative example, plasma or an ionized substance generated in the internal space of the arc chamber 12 is likely to flow into the inner region of a gap 158 (near the attachment end 52b or connection end 56b), as indicated by an arrow X. In the vicinity of the cathode 30 maintained at a high temperature, a deposit caused by an ionized substance is likely to occur and the degree of corrosive wear caused by plasma is greater. For example, if a large amount of metal material is deposited on the outer surface 52c of the thermal break 52, the thermal break 52 will become thicker and the thermal insulation properties of the thermal break 52 will be significantly degraded. Further, if corrosive wear is caused near the attachment end 52b of the thermal break 52 or the connection end 56b of the thermal reflector 56, the attachment strength of such a component will be reduced. Accordingly, frequent maintenance of components constituting the thermal electron emitter 114 will be required in order to stably operate the ion generator.

In the present embodiment, on the other hand, since the narrow structure 60 is provided in the thermal electron emitter 14, the amount of plasma flowing into the gap 58 between the thermal break 52 and thermal reflector 56 can be reduced, and the plasma in the gap 58 can be diluted. Accordingly, the amount of a deposit caused on the outer surface 52c of the thermal break 52, which defines the gap 58, can be reduced, so that the degradation of the thermal insulation properties of the thermal break 52 can be inhibited. Also, the degree of corrosive wear caused on the thermal break 52 and thermal reflector 56, which define the gap 58, can be reduced, so that damage to such components can be inhibited. Accordingly, the frequency of maintenance of components constituting the thermal electron emitter 14 can be decreased, thereby improving the productivity of the ion generator 10 and thermal electron emitter 14. Further, since the thermal break 52 and thermal reflector 56 are not in contact with each other as a gap is provided therebetween at a position where the protruding part 62 is provided, the thermal insulation properties of the thermal break 52 can be maintained. Accordingly, reduction in the amount of emitted thermal electrons can be prevented, so that the ion generator 10 and thermal electron emitter 14 can be stably operated.

FIG. 5A is a sectional view that shows the thermal electron emitter 14 according to a modification 1. The modification 1 differs from the aforementioned embodiment in that, as a protruding part constituting the narrow structure 60, a protruding part 64 is provided on the outer surface 52c of the thermal break 52, instead of the protruding part 62 provided on the inner surface 56c of the thermal reflector 56. As with the protruding part 62, the protruding part 64 is disposed so that the position in the axial direction thereof is included in the middle region C2. By providing the protruding part 64, the amount of plasma flowing into the inner part of the gap 58 can be reduced, so that the frequency of maintenance of components constituting the thermal electron emitter 14 can be decreased.

FIG. 5B is a sectional view that shows the thermal electron emitter 14 according to a modification 2. The modification 2 differs from the aforementioned embodiment in that, as a protruding part constituting the narrow structure 60, a protruding part 66 is formed so that the width $W_A$ of the protrusion thereof in the radial direction is different according to the position in the axial direction. The protruding part 66 has a shape such that the width $W_A$ of the protrusion in the radial direction becomes gradually smaller as the distance from the internal space of the arc chamber is larger. With such a shape, inflow of plasma from the internal space of the arc chamber can be effectively inhibited, and, in addition, the volume of the gap 58 in the bottom region C3 can be increased, so that the plasma density in the bottom region C3 can be lowered. In order to achieve such effects, it is desirable to make the protrusion width $W_A$ of the protruding part 66 sufficiently small in the range of bottom region C3 or not to form the protruding part 66 in the range of the bottom region C3. The protruding part 66 is provided on the thermal reflector 56 in FIG. 5B; however, as another modification, the protruding part 66 of which the protrusion width $W_A$ is different according to the position in the axial direction may be provided on the thermal break 52.

Figure 6A:
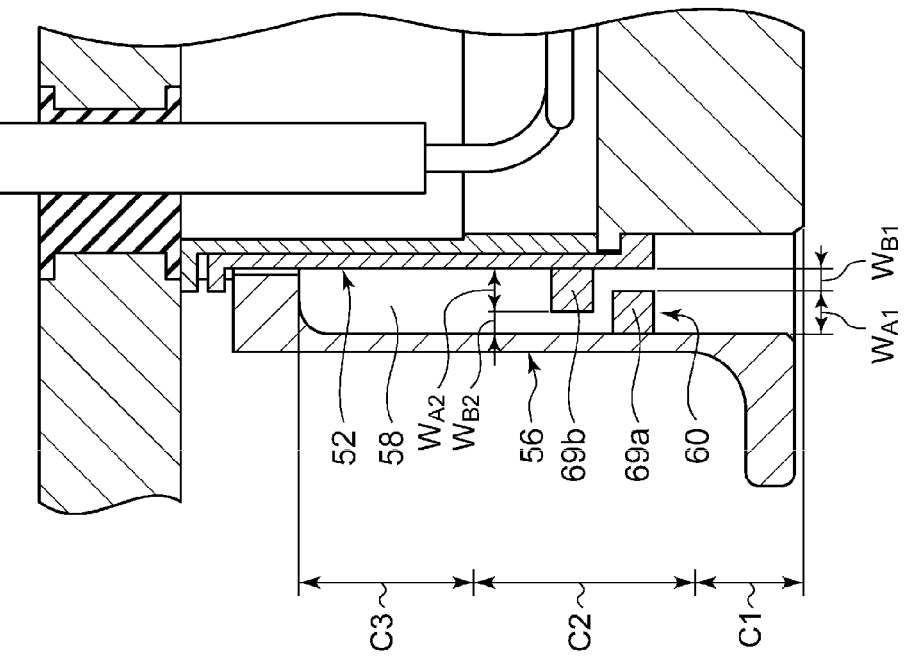
FIG. 6A is a sectional view that shows a thermal electron emitter according to a modification 3.

FIG. 6A is a sectional view that shows the thermal electron emitter 14 according to a modification 3. The modification 3 differs from the aforementioned embodiment in that, as a protruding part constituting the narrow structure 60, a first protruding part 68a is provided on the thermal reflector 56 and a second protruding part 68b is provided on the thermal break 52. The first protruding part 68a and the second protruding part 68b are disposed at positions that overlap with each other in the axial direction, such as at the same position in the same range in the axial direction for example. It is desirable that the sum of the protrusion width $W_{A1}$ in the radial direction of the first protruding part 68a and the protrusion width $W_{A2}$ in the radial direction of the second protruding part 68b is larger than the width $W_B$ in the radial direction between the first protruding part 68a and second protruding part 68b. Accordingly, the amount of plasma flowing into the inner part of the gap 58 can be reduced, so that the plasma density in the bottom region C3 of the gap 58 can be lowered.

Figure 6B:
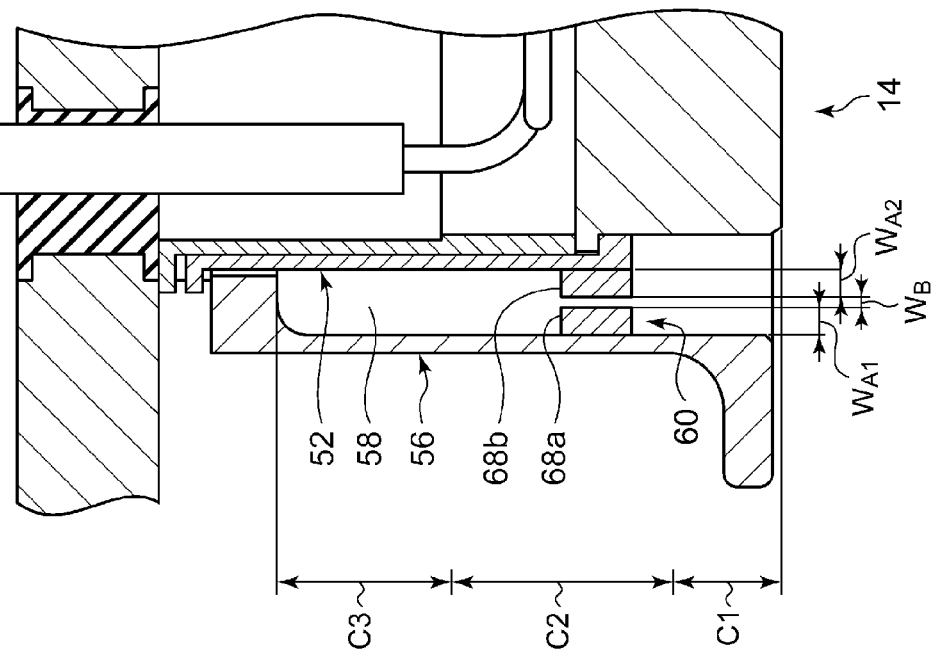
FIG. 6B is a sectional view that shows a thermal electron emitter according to a modification 4.

FIG. 6B is a sectional view that shows the thermal electron emitter 14 according to a modification 4. The modification 4 differs from the aforementioned embodiment in that, as a protruding part constituting the narrow structure 60, a first protruding part 69a is provided on the thermal reflector 56 and a second protruding part 69b is provided on the thermal break 52. The first protruding part 69a and the second protruding part 69b are disposed at positions that do not overlap with each other in the axial direction and that are staggered in the axial direction. The protrusion width $W_{A1}$ in the radial direction of the first protruding part 69a is larger than the width $W_{B1}$ in the radial direction between the first protruding part 69a and the thermal break 52. Similarly, the protrusion width $W_{A2}$ in the radial direction of the second protruding part 69b is larger than the width $W_{B2}$ in the radial direction between the second protruding part 69b and the thermal reflector 56. Accordingly, the first protruding part 69a and second protruding part 69b are arranged to partly overlap with each other in the radial direction. With such a configuration, plasma can be made difficult to enter the inner part of the gap 58, so that the plasma density in the bottom region C3 of the gap 58 can be lowered.

Figure 7:
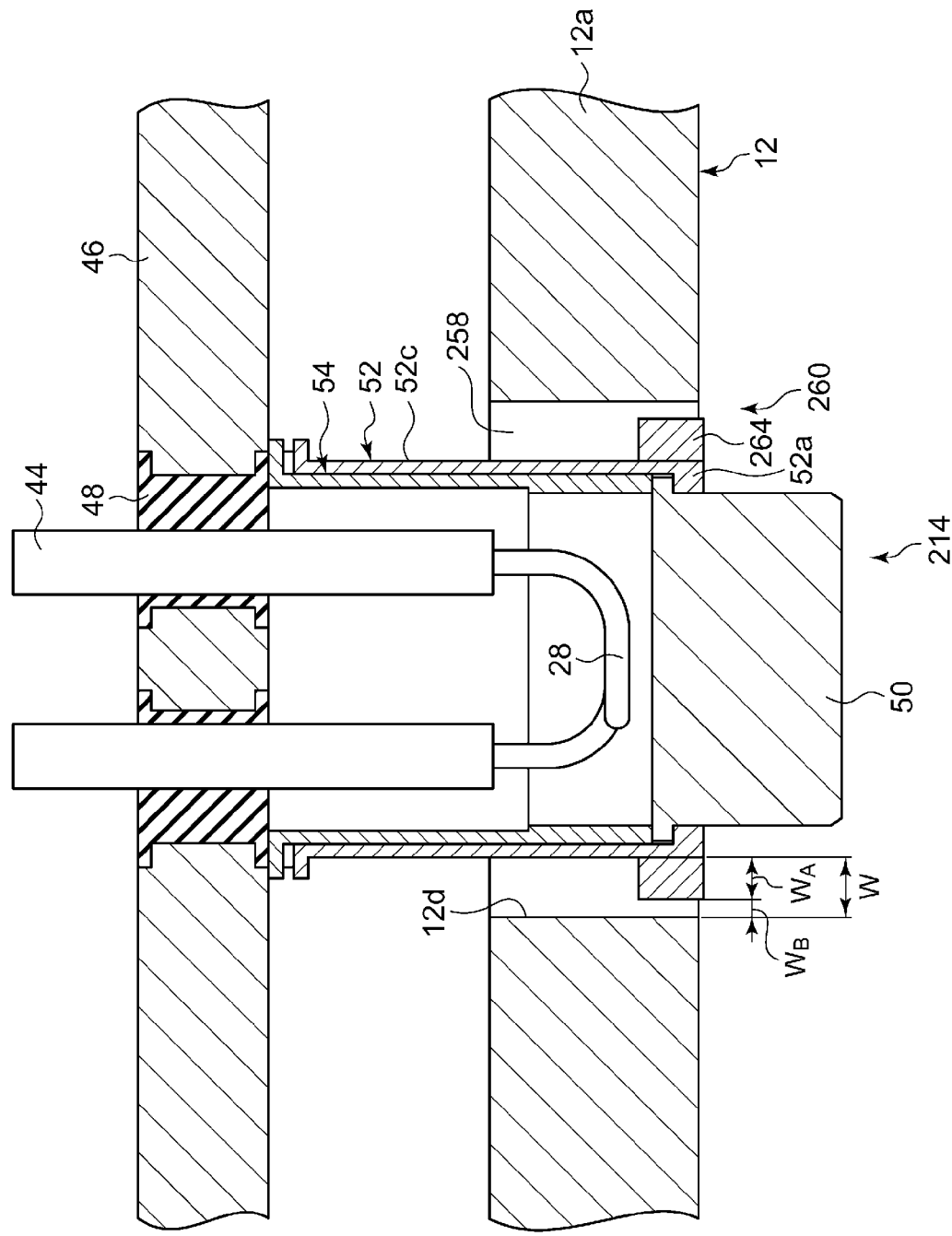
FIG. 7 is a sectional view that shows a configuration of a thermal electron emitter according to another embodiment.

FIG. 7 is a sectional view that shows a configuration of a thermal electron emitter 214 according to another embodiment. The thermal electron emitter 214 according to the present embodiment differs from the thermal electron emitter in the aforementioned embodiment in that the thermal reflector 56, which is arranged around the cathode cap 50 and thermal break 52 in the radial direction in the aforementioned embodiment, is not provided.

In the present embodiment, a protruding part 264 constituting a narrow structure 260 is provided on the outer surface 52c of the thermal break 52. There is a gap 258 between the thermal break 52 and the inner wall of the attachment hole 12d in the upper surface plate 12a, which faces the outer surface 52c of the thermal break 52, and the narrow structure 260 is configured to partly set the width W of the gap 258 in the radial direction to a width $W_B$ that is smaller than the original width W. Accordingly, the amount of plasma flowing out of the internal part of the arc chamber through the gap 258 can be reduced, so that the influence of deposition or corrosive wear on the thermal break 52 provided outside the arc chamber 12 can also be reduced. In the present embodiment, the protruding part 264 may be provided on the inner wall of the attachment hole 12d of the arc chamber 12.

It should be understood that the invention is not limited to the above-described embodiment, but may be modified into various forms on the basis of the spirit of the invention. Additionally, the modifications are included in the scope of the invention.

What is claimed is:

1. An ion generator, comprising:
an arc chamber;
a cathode that extends outward from the inside of the arc chamber in an axial direction and that emits a thermal electron into the arc chamber;
a thermal reflector with a cylindrical shape provided around the cathode in a radial direction and extending in the axial direction; and
a narrow structure configured to narrow a width in the radial direction of a gap between the cathode and the thermal reflector at a predetermined position in the axial direction.

2. The ion generator of claim 1, wherein the cathode and the thermal reflector have the same potential.

3. The ion generator of claim 1, wherein:
the narrow structure includes a protruding part that is provided on at least one of the cathode and the thermal reflector and that protrudes in the radial direction and extends in the axial direction; and
the protruding part narrows the width of the gap in the radial direction at the predetermined position within a section extending in the axial direction.

4. The ion generator of claim 3, wherein the width of the protrusion in the radial direction of the protruding part is larger than the width of the gap in the radial direction within the section extending in the axial direction.

5. The ion generator of claim 3, wherein the protruding part is provided so that the length of the section extending in the axial direction is twice the width of the gap in the radial direction within the section extending in the axial direction or more.

6. The ion generator of claim 3, wherein:
the protruding part includes an inner protruding part provided on the cathode and an outer protruding part provided on the thermal reflector; and
the inner protruding part and the outer protruding part are provided at positions that overlap with each other in the axial direction.

7. The ion generator of claim 3, wherein:
the protruding part includes an inner protruding part provided on the cathode and an outer protruding part provided on the thermal reflector; and
the inner protruding part and the outer protruding part are provided at positions that do not overlap with each other in the axial direction but overlap with each other in the radial direction.

8. The ion generator of claim 1, wherein:
the cathode includes a cathode cap that emits a thermal electron into the arc chamber, and a thermal break with a cylindrical shape that extends outward from the inside of the arc chamber in the axial direction and that fixes the cathode cap; and
the narrow structure is configured to narrow the width in the radial direction between the thermal break and the thermal reflector.

9. The ion generator of claim 3, wherein:
the cathode includes a cathode cap that emits a thermal electron into the arc chamber, and a thermal break with a cylindrical shape that extends outward from the inside of the arc chamber in the axial direction and that fixes the cathode cap; and
the protruding part is not provided on the cathode cap.

10. The ion generator of claim 8, wherein the thermal break includes a latch end for latching the cathode cap, and an attachment end attached to a member provided outside the arc chamber.

11. The ion generator of claim 10, wherein:
the thermal reflector includes a connection end that extends inward in the radial direction toward the thermal break near the attachment end and is connected to the thermal break;
the gap includes a bottom region of which a position in the axial direction is closer to the connection end than a middle position between the latch end and the connection end, and a middle region of which a position in the axial direction is closer to the latch end than the bottom region; and
the narrow structure is configured so that the width in the radial direction is larger in the bottom region than in the middle region.

12. The ion generator of claim 11, further comprising a filament that is provided inside the thermal break and that heats the cathode cap, wherein:
the cathode cap includes a front surface that faces the internal space of the arc chamber, and a rear surface that is latched by the latch end and that faces the filament;
the gap includes a top region of which a position in the axial direction is closer to the front surface than a middle position between the front surface and the rear surface;
the middle region is a region of which a position in the axial direction is closer to the latch end than the top region; and
the narrow structure is configured so that the width in the radial direction is larger in the top region than in the middle region.

13. The ion generator of claim 11, wherein the bottom region is a space in which the plasma density is lower than that in the internal space of the arc chamber.

14. The ion generator of claim 8, further comprising a gas introducing port that introduces a source gas used to generate plasma into the arc chamber, wherein:
the source gas contains a halide; and
the narrow structure inhibits degradation of thermal insulation properties of the thermal break caused by deposition of a conductive substance made from the halide.

15. The ion generator of claim 8, further comprising a gas introducing port that introduces a source gas used to generate plasma into the arc chamber, wherein:
the source gas contains oxygen atom (O); and
the narrow structure inhibits damage to the thermal break caused by a substance made from oxygen.

16. A thermal electron emitter for generating plasma in an arc chamber, comprising:
a cathode that extends outward from the inside of the arc chamber in an axial direction and that emits a thermal electron into the arc chamber;
a thermal reflector with a cylindrical shape provided around the cathode in a radial direction and extending in the axial direction; and
a narrow structure configured to narrow a width in the radial direction of a gap between the cathode and the thermal reflector at a predetermined position in the axial direction.

* * * * *